United States Patent [19]
Takiguchi et al.

[11] Patent Number: 5,280,493
[45] Date of Patent: Jan. 18, 1994

[54] QUANTUM WIRE LASER

[75] Inventors: Haruhisa Takiguchi; Hiroaki Kudo; Mototaka Taneya; Satoshi Sugahara, all of Nara, Japan

[73] Assignees: Sharp Kabushiki Kaisha, Osaka; Optoelectronics Technology Research Laboratory, Tokyo, both of Japan

[21] Appl. No.: 859,587

[22] Filed: Mar. 27, 1992

[30] Foreign Application Priority Data

Mar. 28, 1991 [JP] Japan .................................. 3-064323

[51] Int. Cl.$^5$ ............................................... H01S 3/19
[52] U.S. Cl. ........................................ 372/46; 372/45
[58] Field of Search ............................ 372/46, 45, 43

[56] References Cited

U.S. PATENT DOCUMENTS 5,070,510  12/1991  Konushi et al. ...................... 372/46

FOREIGN PATENT DOCUMENTS

| 61-3487 | 1/1986 | Japan . | |
|---|---|---|---|
| 64-21986 | 1/1989 | Japan . | |
| 0119285 | 5/1990 | Japan .................................... | 372/46 |
| 0268482 | 11/1990 | Japan .................................... | 372/46 |
| WO89/07832 | 9/1989 | PCT Int'l Appl. . | |

OTHER PUBLICATIONS

Fuki et al., *Electronics Letter* (16 Mar. 1989) 25(6):410–411.
Fukui et al., *Japanese Journal of Applied Physics Extended Abstracts of the 22nd Conference on Solid State Devices and Materials* (1990) Tokyo, Japan, pp. 753–756.
Japanese Patent Publication No. 60-113488 (19 Jun. 1985).
Moseley et al., *Journal of Crystal Growth* (1991) 108(1/2):203–218.
Simhony et al., *Proc. Ann. Meeting IEEE Lasers and Electro-Optics Society* (1990) 2:482–483.
*Patent Abstracts of Japan* (5 Oct. 1989) vol. 13, No. 444, (E-828) [3792].

*Primary Examiner*—Georgia Y. Epps
*Attorney, Agent, or Firm*—Morrison & Foerster

[57] ABSTRACT

A quantum wire laser comprises a first multi-layer structure which is formed on a substrate and includes at least one first quantum well layer sandwiched by barrier layers, a second multi-layer structure which is formed on a laminated cross-section of the first multi-layer structure and is obtained by successively laminating a first barrier layer having a band gap larger than that of the first quantum well layer, a second quantum well layer having a band gap nearly equal to that of the first quantum well layer, and a second barrier layer having a band gap larger than those of the first and second quantum well layers, wherein a region for confining electrons is disposed in at least one of regions in the vicinity of the first quantum well layer and the second quantum well layer.

7 Claims, 7 Drawing Sheets

QUANTUM WIRE LASER

BACKGROUND OF THE INVENTION

1. Field of the invention

The present invention relates to a current-injection type quantum wire laser utilizing a line shape density in order to obtain a semiconductor laser with characteristics such as a small driving current value, less temperature dependency, and a narrow spectral line width.

2. Description of the prior art

In the past, a quantum well laser has been developed having a density of state in a stair shape due to a quantum well having a two-dimensional quantum wire. Moreover, a quantum wire laser has been developed as a quantum effect laser having a density of state in a line spectrum shape due to a one-dimensional quantum wire.

FIGS. 7a and 7b represent a method for producing a quantum wire laser contrived in the past (See Japanese Laid-Open Patent Publication No. 64-21986). FIGS. 7a and 7b are a sectional view showing a quantum wire laser and a sectional shape of a ridge or a growth layer on the ridge, respectively. The reference numeral 71 denotes an n-GaAs substrate, 72 an n-AlGaAs cladding layer, 73 an n-AlGaAs graded layer, 74 a GaAs quantum well layer, 75 a p-AlGaAs graded layer, 76 a current blocking layer, 77 a p-AlGaAs cladding layer, and 78 a p-GaAs contact layer. The sectional shape shown in FIG. 7b can be produced by forming a ridge on the n-AlGaAs cladding layer 72 in a [110] direction and successively growing the n-AlGaAs graded layer 73, the GaAs quantum well layer 74, the p-AlGaAs graded layer 75, the current blocking layer 76, the p-AlGaAs cladding layer 77, and the p-GaAs contact layer 78 by Metal Organic Chemical Vapor Deposition (MOCVD). The growth of this structure utilizes the characteristics of the MOCVD method that the growth rate on a (111) B facet (slant faces of a triangle in FIG. 7) is markedly smaller than that on a (100) surface. The GaAs quantum well layer 74 is surrounded by the n-AlGaAs graded layer 73, the current blocking layer 76, and the p-AlGaAs graded layer 75. A width $W_2$ of the GaAs quantum well layer 74 on the side of the graded layer 73, a width $W_1$ of the GaAs quantum well layer 74 on the side of the graded layer 75, and a thickness b of the GaAs quantum well layer 74 are formed so as to be 194 Å, 123 Å, and 50 Å, respectively. These values are as small or smaller than the de Broglie wavelength, so that a quantum wire is formed in the GaAs quantum well layer 74.

However, there is a problem in the quantum wire laser shown in FIGS. 7a and 7b. More particularly the quantum wire typically has insufficient geometrical precision. In order for the quantum wire to satisfactorily function, it is required that the absolute value of the quantized level of the quantum wire be set with a precision on the order of angstroms. It will be appreciated that the accuracy of the thickness b of the GaAs quantum well layer 74 is determined by the growth rate on the (100) facet. The growth rate of a semiconductor can be regulated with a sufficient precision on the order of angstroms by high performance growth methods such as the MOCVD method. The widths of $W_1$ and $W_2$ of the GaAs quantum well layer 74 are determined by a ridge width l of the n-AlGaAs cladding layer 72 and a height $h_1$ of the n-AlGaAs graded layer 73. The accuracy of the ridge width l depends on the accuracy provided by the light or electron beam lithography. The precision of the lithography is 0.1 pm, so that the precisions of the widths $W_1$ and $W_2$ are 0.1 μm. Thus, the absolute value of the quantization level of the quantum wire cannot be regulated with good reproducibility and because of the above-mentioned problem, it has been difficult in the past to produce a quantum wire laser having a line shape density of state.

SUMMARY OF THE INVENTION

The quantum wire laser of this invention, which overcomes the above-discussed and numerous other disadvantages and deficiencies of the prior art, comprises a first multi-layer structure which is formed on a substrate and includes at least one first quantum well layer sandwiched by barrier layers, a second multi-layer structure which is formed on a cross-section of the first multi-layer structure and is obtained by successively laminating a first barrier layer having a band gap larger than that of the first quantum well layer, a second quantum well layer having a forbidden band width nearly equal to that of the first quantum well layer, and a second barrier layer having a forbidden band width larger than those of the first and second quantum well layers, wherein a region for confining electrons is disposed in at least one of regions in the vicinity of the first quantum well layer and the second quantum well layer.

In a preferred embodiment, a ridge in a reverse mesa shape is formed in a [110] direction.

In a preferred embodiment, a plurality of quantum wires are arranged in parallel in a laser cavity direction.

In a preferred embodiment, a group of quantum wire layers are laminated as the first quantum well layer.

The second multi-layer structure including the second quantum well layer is fabricated on a cross-section of the first multi-layer structure including the first quantum well layer, and the layer thickness and the line width are controlled with high preciseness, whereby the geometry of the quantum wire can be determined.

Thus, the invention described herein makes possible the objective of providing a quantum wire laser confining electrons in a one-dimensional by regulating the line width as well as the thickness on the order of angstroms so as to provide geometrical precision of the quantum wire.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 1A:
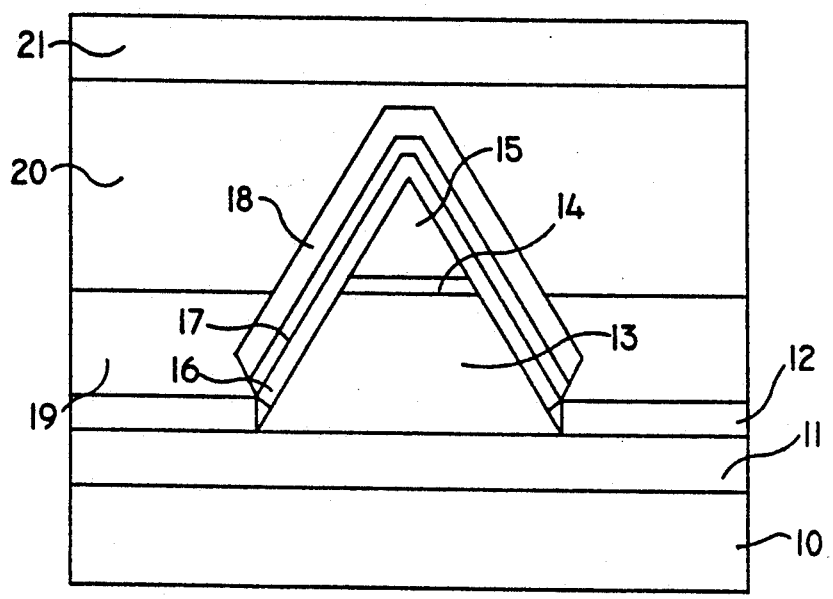
FIGS. 1a and 1b cross-sectional views of a quantum according to a first example of the present invention.

Hereinafter, the present invention will be described in detail by way of illustrating examples using AlGaAs/GaAs as a material. The invention will be described with reference to the drawings, wherein like reference numerals are used to refer to like elements throughout.

EXAMPLE 1

Figure 1B:
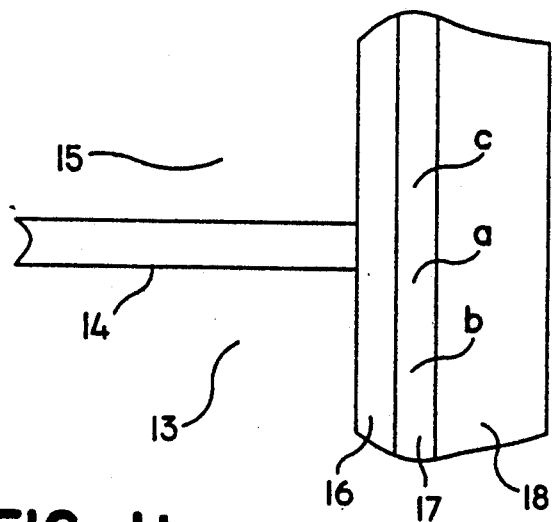
Figure 2A:
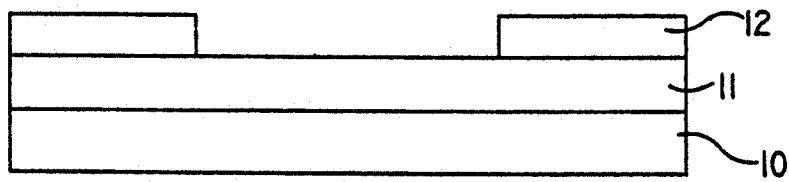
FIGS. 2a, 2b, 2c, and 2d are cross-sectional views illustrating the steps of fabricating the quantum wire according to the first example of the present invention.
Figure 2B:
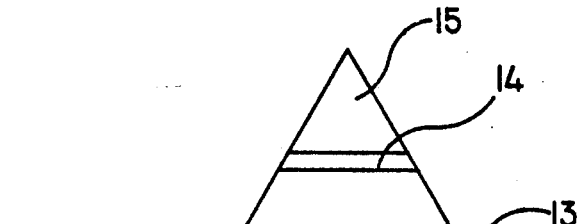

FIGS. 1a and 1b show the fundamental structure of a quantum wire in a first example according to the present invention. FIGS. 2a to 2d show the preferred steps of producing the structure shown in FIGS. 1a and 1b. First, an n-AlGaAs cladding layer 11 is laminated on an n-GaAS (001) substrate 10, and then a dielectric film 12 (for example, $SiO_2$, SiN, etc.) is deposited thereon to form a long stripe-shaped opening extending in a [110] direction (FIG. 2a). On the substrate thus obtained, an n-$Al_xGa_{1-x}As$ (x=0.5) barrier layer 13, an un-$Al_xGa_{1-x}As$ (x=0.05) first quantum well layer 14, and a semi-insulating (hereinafter, referred to as SI) $Al_xGa_{1-x}As$ (x=0.5) barrier layer 15 are successively laminated by the MOCVD method at a growth temperature of 650° C. and under reduced pressure to form a first laminated structure (FIG. 2b). As is shown in FIG. 2b, when each layer is grown under the condition that the growth rate in a direction vertical to a (111) B facet is small, a growth layer having a triangular cross-section appeared without the growth of layers on the side of the triangle.

Figure 2C:
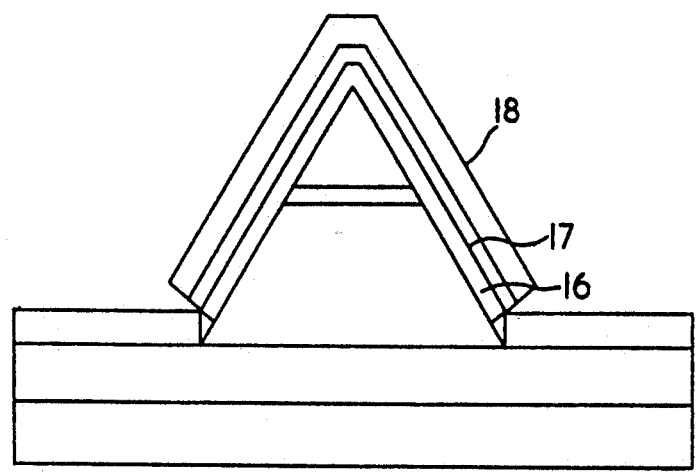
Figure 2D:
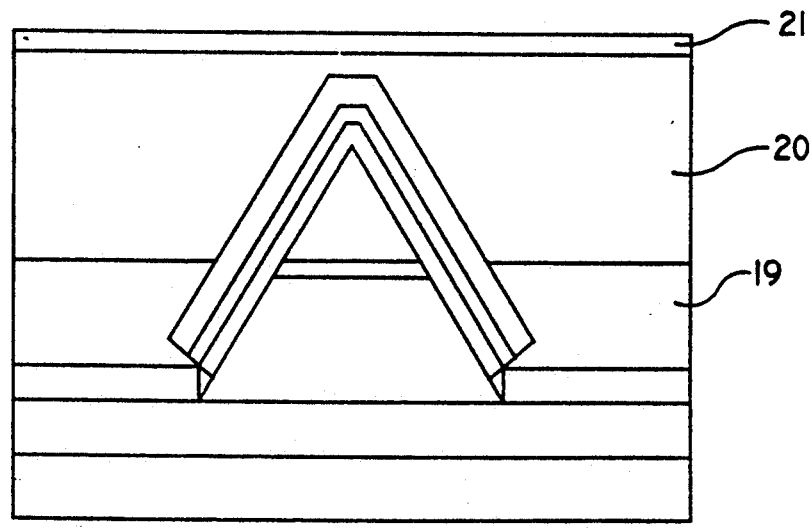

Next, a growth temperature is raised to 850° C., and an un-$Al_xGa_{1-x}As$ (x=0.5) first barrier layer 16, an un-GaAs second quantum well layer 17, and an un-$Al_xGa_{1-x}As$ (x=0.5) second barrier layer 18 are successively laminated to form a second multi-layer structure (FIG. 2c). At a high temperature of 850° C., layers can be grown also on the side of the triangle as is shown. Then, the pressure of a reactor is changed from reduced pressure to atmospheric pressure, and an SI-$Al_xGa_{1-x}As$ (x−0.5) barrier layer 19, a p−$Al_xGa_{1-x}As$ (x=0.5) cladding layer 20, and a p-GaAs contact layer 21 are successively laminated at 650° C. (FIG. 2d). Crystals (polycrystals) can be grown on the dielectric film 12 by setting the reactor pressure at atmospheric pressure. Finally, p-side and n-side electrode (not shown) are formed, and a semiconductor laser can be produced by forming a cavity by the use of a cleavage and the like.

The quantum wire structure of the present invention will be described in detail by using FIG. 1b. The un-$Al_xGa_{1-x}As$ (x=0.05) first quantum well layer 14 is surrounded with three $Al_xGa_{1-x}As$ (x=0.5) barrier layers 13, 15, and 16. Moreover, the un-GaAs second quantum well layer 17 is disposed in the vicinity of the first quantum well layer 14. A quantized level energy of an electron in regions a, b, and c in which the second quantum well layer 17 crosses the first quantum well layer 14 is calculated. According to the results, the quantized level energy of the crossing regions b and c is larger than that of the region a. Because of this, it is found that the electron is confined in the region a. Hereinafter, this phenomenon will be described from the physical viewpoint. The height of the barrier to the electron in the regions b and c becomes an energy barrier between the barrier layers 13, 15, 16, and 18 and the second quantum well 17. The quantized level energy is determined by the band gaps of the second quantum well 17 and the barrier layers 13, 15, 16, and 18. On the other hand, in the region a, there is a probability that the electron exists in the first quantum well layer 14 having a small band gap, so that as a whole, the quantized level energy of the region a is smaller than those of the regions b and c. As a result, the electron in the region a cannot go out into the regions b and c, whereby the quantum wire can be realized. The energy level of the quantum wire is determined by the shape of the quantum wire to be confined. However, according to the structure of the present invention, the energy level is determined wholly by a width of the first quantum well layer 14, a width of the second quantum well 17, a thickness of the first barrier layer 16, and the respective band gaps of the barrier layer 13, the first quantum well layer 14, the barrier layer 15, the first barrier layer 16, the second quantum well 17, and the second barrier layer 18. The accuracy of the layer thickness and band gap depend upon the accuracy of a crystal growth rate and a mixed crystal content ratio control, and in a high performance apparatus using the MOCVD method and the like, both of the content are sufficient. Thus, the quantized level energy of the quantum wire according to the present invention can be set with sufficient accuracy.

Next, a current confinement mechanism will be described. It is important to concentrate a current in a quantum wire in a semiconductor laser. According to the structure of the present invention, the current can be concentratively flowed into the quantum wire through the p-AlGaAs cladding layer 20 and the n-AlGaAs barrier layer 13 by disposing the SI−$Al_xGa_{1-x}As$ barrier layers 15 and 19.

EXAMPLE 2

Figure 3:
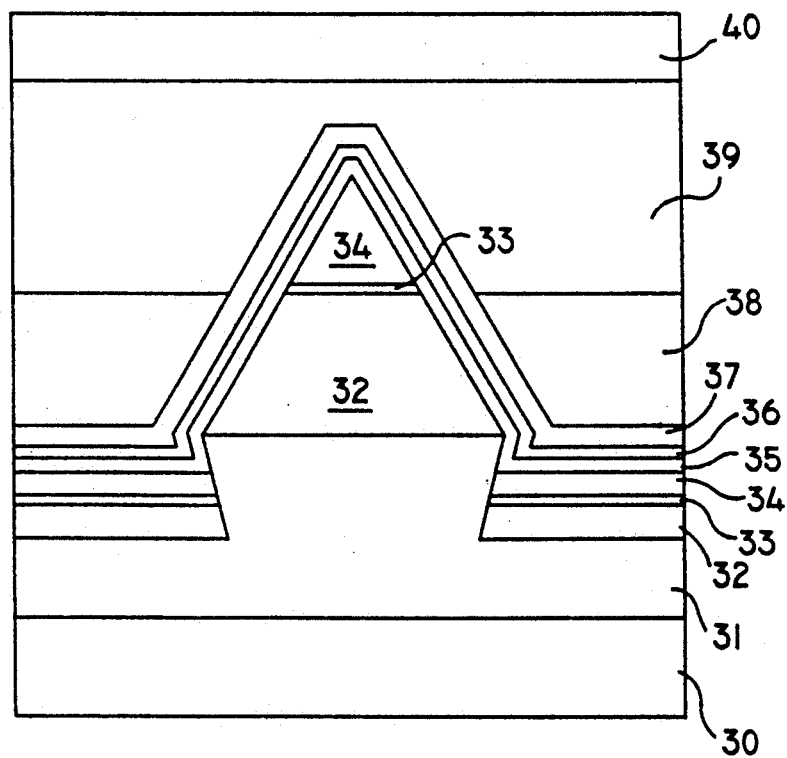
FIG. 3 is a cross-sectional view illustrating a quantum wire according to a second example of the present invention.

FIG. 3 shows a second example of the present invention. According to the second example of the present invention, a quantum wire is formed by using an orientation-dependent growth on a ridge instead of forming a stripe with the dielectric film 12 as is shown in FIG. 1. As is shown in FIG. 3, a cross-section having a triangular shape is formed on a ridge. A method for producing this type of quantum wire will now be described. An n-AlGaAs cladding layer 31 is laminated on an n-GaAs (001) substrate 30 to form a reverse mesa-shaped ridge on the cladding layer 31 in a [110] direction. An n-AlGaAs barrier layer 32, an un-$Al_xGa_{1-x}As$ (x=0.05) first quantum well layer 33, and an SI-AlGaAs barrier layer 34 are successively grown under the conditions that the growth rate on a (111) B facet became near zero such that crystals are not grown on the (111) B facet.

Therefore, the above-mentioned growth is continued until a cross-section having a triangular shape is obtained, and then the growth on the ridge is stopped. Next, an n-AlGaAs barrier layer 35, an un-GaAs second quantum well layer 36, and a p-AlGaAs barrier layer 37 are successively grown under the condition that the crystals grew on the (111) B facet. In this step, the second quantum well layer 36 is formed on the (111) B facet (slant faces of the triangle). Then, an SI-AlGaAs cladding layer 38, a p-AlGaAs cladding layer 39, and a p-GaAs contact layer 40 are successively laminated. The quantum wire structure and the current confinement mechanism are formed in the same way as in the first example.

In the first and second examples, a single first quantum well layer (14 or 33) is formed. However, a multi-quantum well structure is also possible in which a plurality of quantum wells are laminated within a distance (approximately tens of angstroms) in which the electrons interact.

EXAMPLE 3

Figure 4:
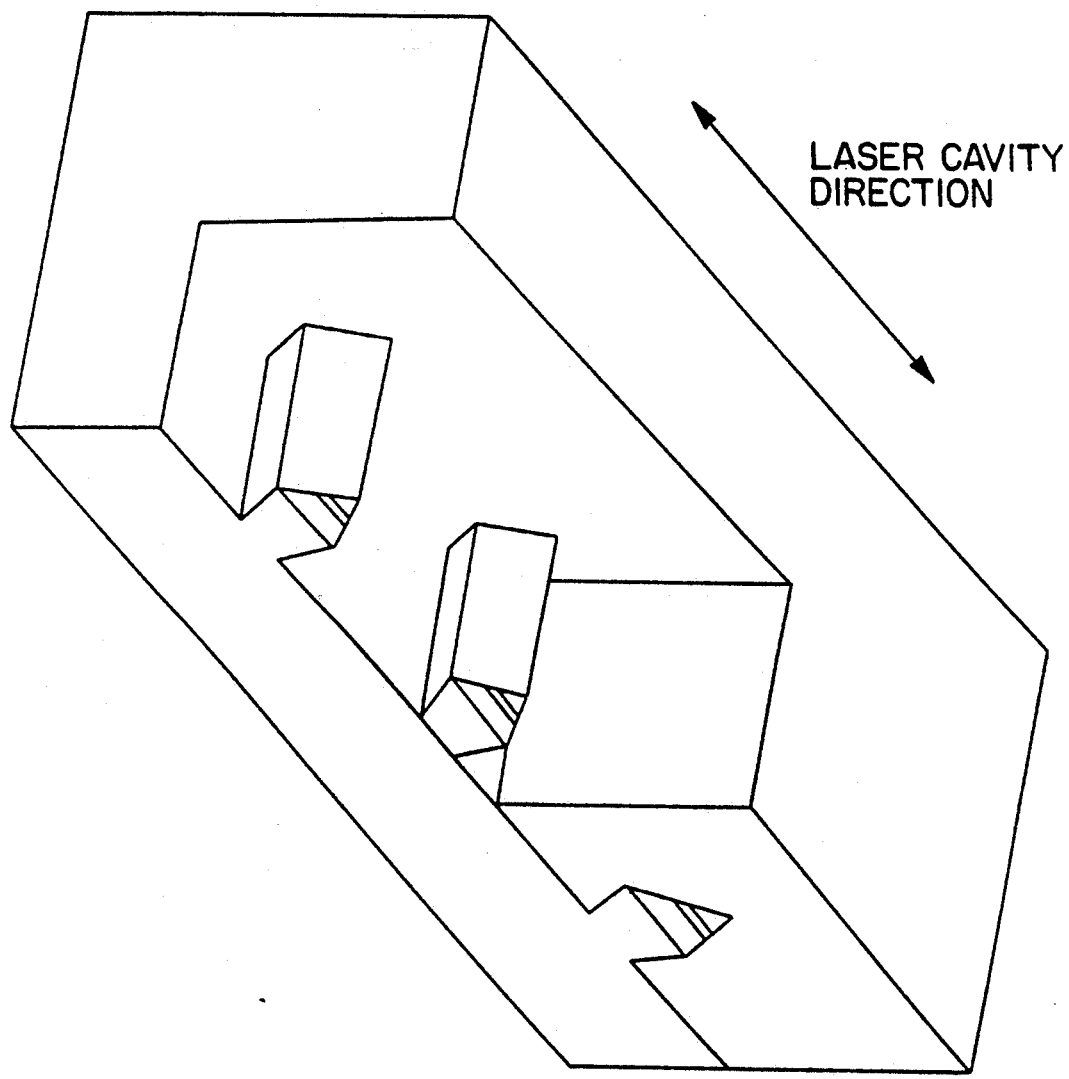
FIG. 4 is a perspective view illustrating a quantum wire according to a third example of the present in which a plurality of quantum wires are arranged in parallel.

FIG. 4 shows a third example of the present invention (the detailed structure of each individual quantum wire is as shown in FIG. 3 and, therefore, is omitted). The gain of the quantum wire per unit volume is large; however, the volume is small, so that the total gains are not large. As a result, it is desirable that a plurality of quantum wires are arranged in parallel. In FIG. 4, a plurality of quantum wires on a ridge as shown in FIG. 3 are arranged in a laser cavity direction, and the period is made $m + \frac{1}{2}$ times the wavelength in a cavity of the laser beam (wherein m is an integer) so as to adjust the optical period to the period of the gain. Thus, the peak position of the standing wave of the laser beam can be aligned with the quantum wire position so that the gain can be efficiently provided to the laser beam. Moreover, the periodical modulations of index of refraction and gain are realized due to the periodical arrangement of the quantum wires. As a result, the laser oscillation can be realized by the same optical amplification mechanism as that of a conventional distributed-feedback type semiconductor laser.

EXAMPLE 4

Figure 5:
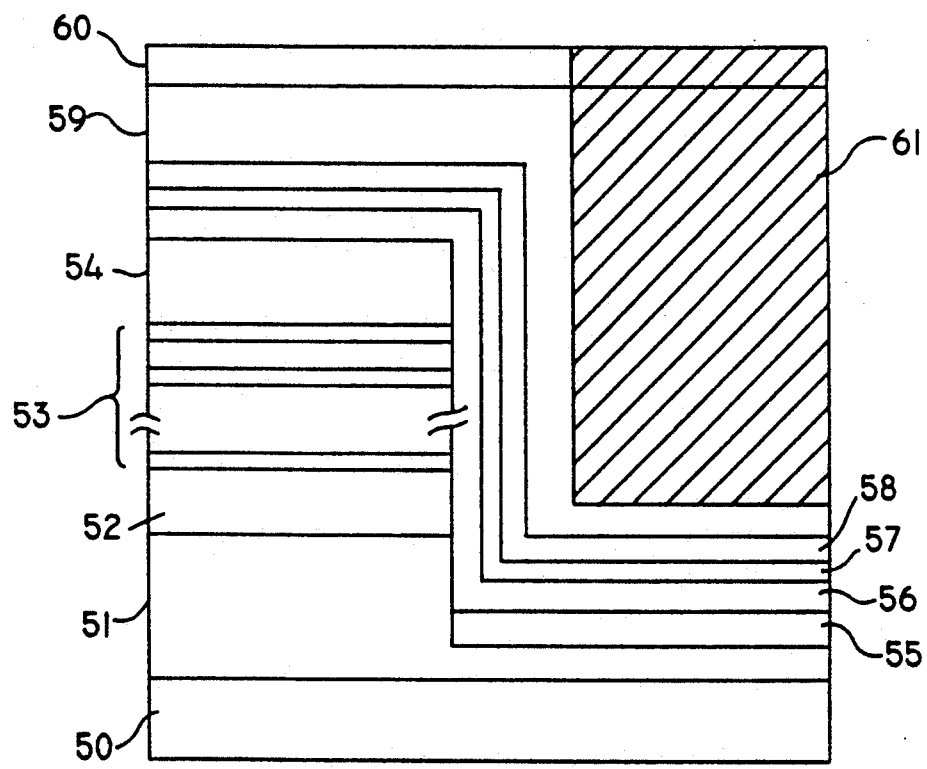
FIG. 5 is a cross-sectional view illustrating a quantum structure according to a fourth example of the present invention in which a group of quantum wells is laminated as a first quantum well.
Figure 6A:
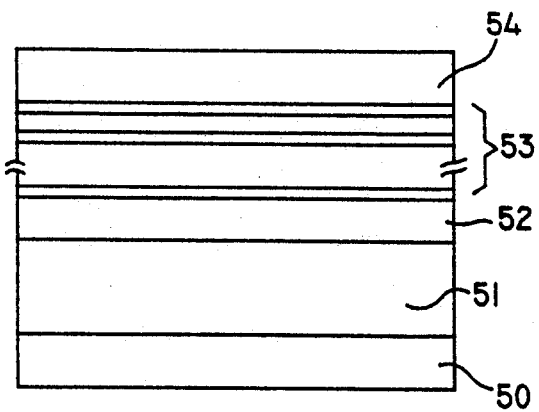
FIGS. 6a, 6b, 6c, 6d, and 6e are cross-sectional views illustrating the steps of producing a quantum wire structure according to the fourth example of the present invention in which a group of quantum wells is laminated as a first quantum well.
Figure 6B:
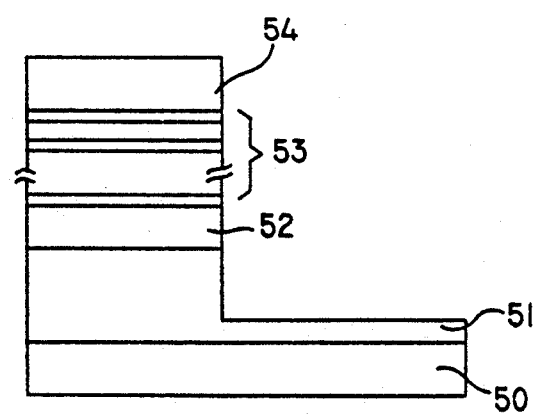
Figure 6C:
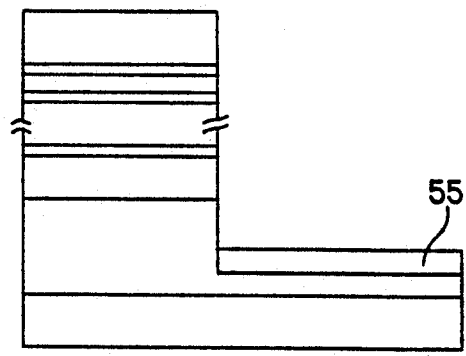

FIG. 5 shows a fourth example of the present invention. FIGS. 6a to 6e show the steps of producing the fourth example of a quantum wire structure according to the present invention. First, an n-AlGaAs cladding layer 51, an n-Al$_x$Ga$_{1-x}$As (x=0.5) barrier layer 52, a group of un-AlxGa$_{1-x}$As (x=0.05) first quantum wells 53, and a p-Al$_x$Ga$_{1-x}$As (x=0.5) barrier layer 54 are laminated on an n-GaAs (001) substrate 50 (FIG. 6a). A terrace is formed by etching in a [110] direction, and a p-AlGaAs current confinement layer 55 is formed by diffusing Zn on the n-AlGaAs cladding layer 51 which is a lower layer of the terrace (FIGS. 6b and 6c).

Figure 6D:
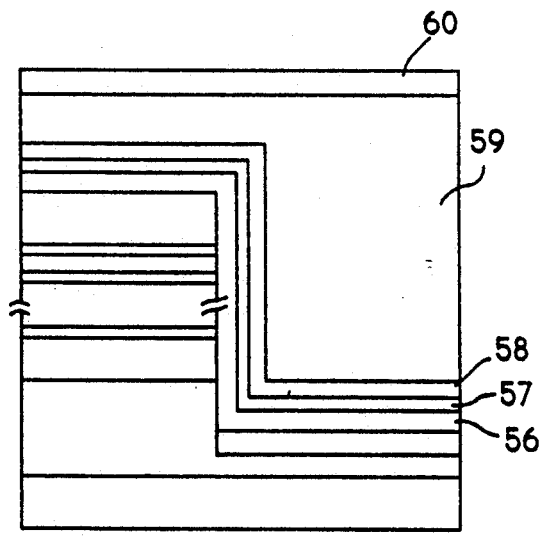
Figure 6E:
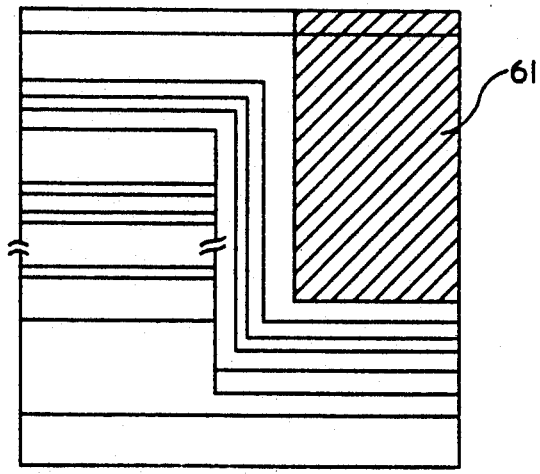
Figure 7A:
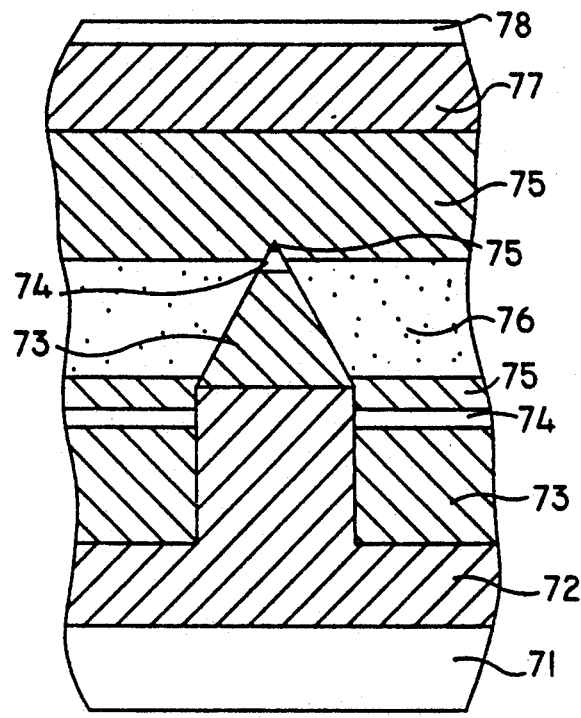
FIGS. 7a and 7b are cross-sectional views illustrating a conventional quantum wire laser device.
Figure 7B:
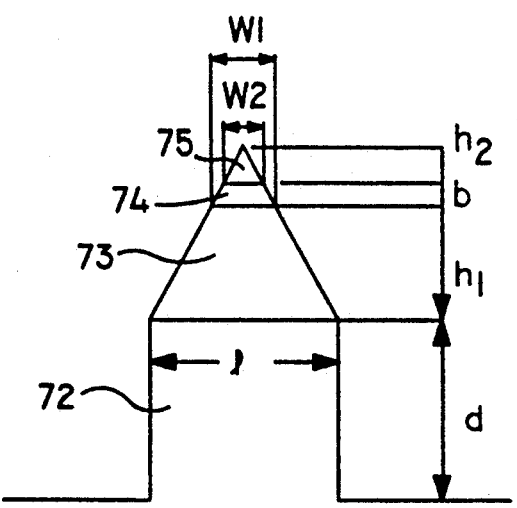

Thereafter, an un-Al$_x$Ga$_{1-x}$As (x=0.5) barrier layer 56, an un-GaAs second quantum well 57, an un-Al$_x$Ga$_{1-x}$As (x=0.5) barrier layer 58 an n-Al$_x$Ga$_{1-x}$As (x=0.5) cladding layer 59, and an n-GaAs contact layer 60 are successively laminated on the upper face, side face, and lower face of the terrace so as to have a uniform thickness, respectively (FIG. 6d). Then, Zn is diffused in a region 61 including respective portions of the n-Al$_x$Ga$_{1-x}$As cladding layer 59 and the n-GaAs contact layer 60 except for the terrace (FIG. 6e). The current is injected into the second quantum well 57 through the n-GaAs substrate 50 and the Zn-diffused region of the n-GaAs contact layer 60. In the fourth example, a group of quantum wells are laminated as the first quantum well, so that the total gains can be increased.

The present invention is described above in the context of a AlGaAs/GaAs system; however, a quantum wire structure can be produced in the same way even when a GaInPAs/InP system is used.

As is described above, according to the present invention, a quantum wire semiconductor laser of a current injection type having a line shape density which has been difficult to be produced by the conventional method is made possible. Moreover the quantum wire semiconductor laser having much more desirable characteristics compared with the conventional quantum well semiconductor laser having a stair shape density of state can be realized.

It is understood that various other modifications will be apparent to and can be readily made by those skilled in the art without departing from the scope and spirit of this invention. Accordingly, it is not intended that the scope of the claims appended hereto be limited to description as set fourth herein, but rather that the claims be construed as encompassing all the features of patentable novelty that reside in the present invention, including all features that would be treated as equivalents thereof by those skilled in the art to which this invention pertains.

What is claimed is:

1. A quantum wire laser comprising a first multi-layer structure which is formed on a substrate and includes at least one first quantum well layer sandwiched by barrier layers, a second multi-layer structure which is formed on a cross-section of the first multi-layer structure and is obtained by successively laminating a first barrier layer having a band gap larger than that of the first quantum well layer, a second quantum well layer having a band gap nearly equal to that of the first quantum well layer, and a second barrier layer having a band gap larger than those of the first and second quantum well layers, wherein a region for confining electrons is disposed in at least one of regions in the vicinity of the first quantum well layer and the second quantum well layer.

2. A quantum wire laser according to claim 1, wherein a ridge in a reverse mesa shape is formed in a [110] direction.

3. A quantum wire laser according to claim 1, wherein a plurality of quantum wires are arranged in parallel in a laser cavity direction.

4. A quantum wire laser according to claim 1, wherein a group of quantum wire layers are laminated as the first quantum well layer.

5. A quantum wire laser according to claim 1, wherein said substrate (10) is made of an n-GaAs, said first quantum well layer (14) is made of an un-Al$_x$Ga$_{1-x}$As (x=0.05), one (13) of said barrier layers which is laminated on an n-AlGaAs cladding layer (11) which is laminated on said substrate (10) is made of an n-Al$_x$Ga$_{1-x}$As (x=0.5), the other (15) of said barrier layers which is laminated on said first quantum layer (14) is made of a semi-insulating Al$_x$Ga$_{1-x}$As (x=0.5), said first (16) and second (18) barrier layers are made of an un-Al$_x$Ga$_{1-x}$As (x−0.5), and said second quantum well layer (17) is made of an un-GaAs.

6. (Added) A quantum wire laser according to claim 1, wherein said substrate (30) is made of an n-GaAs, said first quantum well layer (33) is made of an un-Al$_x$Ga$_{1-x}$As (x=0.5), one (32) of said barrier layers which is laminated on said substrate (30) is layer (31) which is laminated on said substrate (30) is made of an n-AlGaAs, the other (34) of said barrier layers which is laminated on said first quantum well layer (33) is made of a semi-insulating AlGaAs, said first barrier layer (35) is made of an n-AlGaAs, said second barrier layer (37) is made of a p-AlGaAs, and said second quantum well layer is made of an un-GaAs.

7. (Added) A quantum wire laser according to claim 4, wherein said substrate (50) is made of an n-GaAs, said first quantum well layer (53) is made of an un-$Al_xGa_{1-x}As$ (x=0.5), one (52) of said barrier layers which is laminated on an n-AlGaAs cladding layer (51) which is laminated on said substrate (50) is made of an n-$Al_xGa_{1-x}As$ (x=0.5), the other (54) of said barrier layers which is laminated on said first quantum well layer (53) is made of a p-$Al_xGa_{1-x}As$ (x=0.5), said first (56) and second (58) barrier layers are made of an un-$Al_xGa_{1-x}As$ (x=0.5), and said second quantum well layer (57) is made of an un-GaAs.

* * * * *